(12) United States Patent
Clarke

(10) Patent No.: US 6,788,157 B2
(45) Date of Patent: Sep. 7, 2004

(54) PROGRAMMABLE FREQUENCY SYNTHESIZER

(75) Inventor: Robert M. Clarke, Gloucester, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/281,605

(22) Filed: Oct. 28, 2002

(65) Prior Publication Data

US 2004/0080373 A1 Apr. 29, 2004

(51) Int. Cl.$^7$ .............................. H03B 19/00; H04B 1/06

(52) U.S. Cl. ....................... 331/74; 455/255; 455/260

(58) Field of Search ...................... 331/25, 74; 327/115, 327/117, 156–159; 455/255, 256, 260, 313, 318, 323

(56) References Cited

U.S. PATENT DOCUMENTS 4,641,101 A * 2/1987 Selim .......................... 327/117

* cited by examiner

Primary Examiner—David Mis
(74) Attorney, Agent, or Firm—Wolf, Greenfield & Sacks, P.C.

(57) ABSTRACT

A programmable frequency synthesizer including a voltage-controlled oscillator, a regenerative frequency divider and a programmable integer divider, that provides wideband frequency coverage from a single narrowband oscillator. The voltage-controlled oscillator may generate a first signal having a first frequency. The regenerative frequency divider is coupled to the voltage-controlled oscillator and receives the first signal and performs a fractional multiplication of the first frequency of the first signal to provide a second signal a having a second frequency. The programmable integer divider is coupled to the regenerative frequency divider, and receives the second signal and divides the second frequency by a predetermined integer to provide a third signal having a third frequency.

24 Claims, 6 Drawing Sheets

PROGRAMMABLE FREQUENCY SYNTHESIZER

BACKGROUND

1. Field of the Invention

The present invention relates to a method and apparatus for generating wideband frequency coverage from a narrow-band voltage control oscillator, and in particular to a programmable frequency synthesizer.

2. Discussion of Related Art

Many applications, such as radio and television (TV) tuners, cable modems, and test equipment, require receivers that are able to tune over a wide frequency band, for example, from approximately 50 Megahertz (MHz) to 1000 MHz, or over multiple frequency bands. One conventional method to generate wide or multiple frequency bands is to include multiple voltage-controlled oscillators in the receiver. For example, the receiver may be provided with a number of oscillators, each tuned for a different frequency range, and a switch may be used to select the output of one oscillator at a time, depending on the desired frequency range at the time. Alternatively, the receiver may include circuitry to mix the outputs of two or more oscillators, for example one tunable oscillator and one fixed oscillator, to produce sum and difference frequencies. Multiple tuned circuits are then required to select either the appropriate sum or difference frequency. For example, in H.F. receivers, the output of a variable frequency oscillator tuning over, for example, a 500 kilohertz (kHz) range is mixed with the output of a crystal oscillator. Different crystals are switched in to select different frequency ranges. In another example, used in radio frequency (R.F.) instrumentation, Yttrium Iron Garnet (YIG) tuned oscillators, operating at several gigahertz (GHz), may be mixed to provide an output frequency range from a few Hertz to approximately 1000 MHz.

Another conventional solution is to use a single voltage-controlled oscillator and to select one of several resonant (tank) circuits for each range of frequencies needed. The value of one or more of the components of any of the resonant circuits may be changed by switching in more inductance or capacitance to change the frequency coverage. A problem encountered in these solutions is that the voltage-controlled oscillators require a high voltage, for example, 25 to 30 volts (V), for the voltage-variable capacitors (or varactor diodes) to tune over a large capacitance, and thus frequency range. This may be undesirable, particularly in applications where the other components of the receiver circuitry operate on a low voltage, for example, 3 to 5 V. Furthermore, the requirement of either multiple oscillators or multiple resonant circuits results in complex, expensive circuitry and bulky receivers.

Another conventional solution is to use direct digital synthesis (DDS) to generate the desired frequency range. However, current technology limits the operating frequency of DDS systems to below 300 MHz.

SUMMARY OF THE INVENTION

According to one embodiment, a programmable frequency synthesizer may comprise a voltage-controlled oscillator that provides a first signal, a regenerative frequency divider coupled to the voltage-controlled oscillator that receives the first signal and performs a fractional multiplication of a first frequency of the first signal to provide a second signal having a second frequency, and a programmable integer divider, coupled to the regenerative frequency divider, that receives the second signal and divides the second frequency by a predetermined integer to provide a third signal having a third frequency.

In another embodiment, a tunable receiver, operable over a wide frequency band, may comprise a programmable frequency synthesizer including a voltage-controlled oscillator, and adapted to generate an output signal having a frequency derived from a combination of the voltage-controlled oscillator, a regenerative frequency divider and a programmable integer divider. The tunable receiver may further comprise a phase-locked loop coupled to the programmable frequency synthesizer to tune an operating frequency of the voltage-controlled oscillator, and a loop filter coupled to an output of the phase-locked loop and to an input of the programmable frequency synthesizer. In one example, the programmable frequency synthesizer may include the voltage-controlled oscillator that provides a first signal, the regenerative frequency divider coupled to the voltage-controlled oscillator that receives the first signal and performs a fractional multiplication of a frequency of the first signal to provide a second signal having a second frequency, and the programmable integer divider, coupled to the regenerative frequency divider, that receives the second signal and divides the second frequency by a predetermined integer to provide the output signal having a third frequency.

According to another embodiment, a method for synthesizing an output signal having an output frequency range may comprise acts of generating, with an oscillator, a first signal having a first frequency range and performing a fractional multiplication of the first frequency range of the first signal to provide a second signal having a second frequency range. The method may further comprise an act of dividing the second frequency range with an integer divider to obtain the output signal having the output frequency range, wherein the output frequency range is larger than the first frequency range.

According to yet another embodiment, a programmable frequency synthesizer may comprise a voltage-controlled oscillator to generate a first signal having a first frequency range, and means for synthesizing, from the first signal, an output signal having an output frequency range that is larger than the first frequency range, said means being adapted to receive the first signal from the voltage-controlled oscillator. In one example, the means for synthesizing may include a regenerative frequency divider, coupled to the voltage-controlled oscillator, and an integer divider coupled to the regenerative frequency divider. In another example, the means for synthesizing may further include a quadrature generator, wherein the output signal is a differential output signal including at least one in-phase component and at least one quadrature component.

BRIEF DESCRIPTION OF THE DRAWINGS

The foregoing, and other objects, features and advantages of the apparatus and method will be apparent from the following non-limiting description of various exemplary embodiments, and from the accompanying drawings, in which like reference characters refer to like elements throughout the different figures. In the drawings.

DETAILED DESCRIPTION

Figure 1:
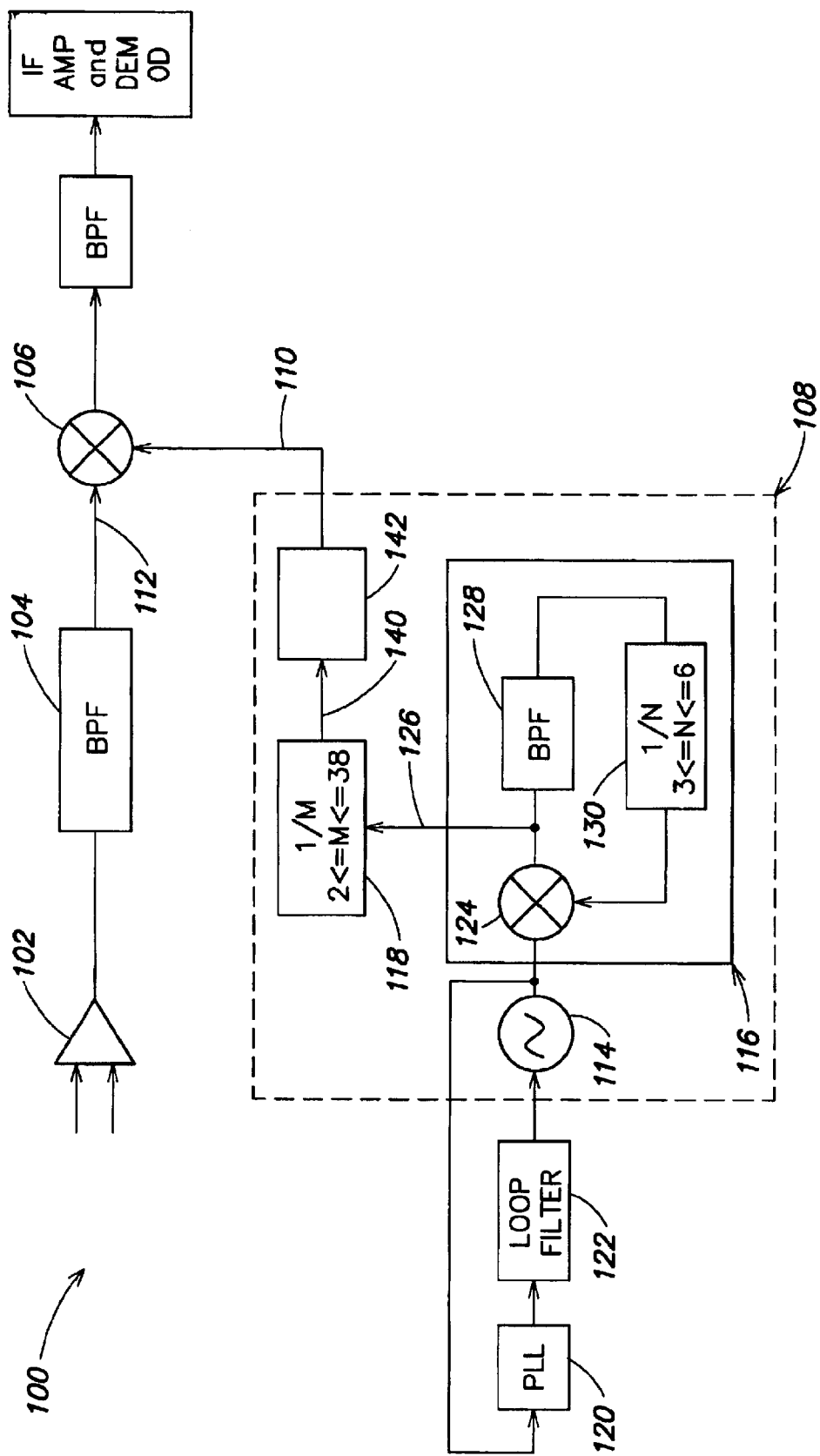
FIG. 1 is a schematic block diagram of an example of a receiver according to the present invention.

Referring to FIG. 1, there is illustrated a block diagram of an exemplary embodiment of a receiver 100 according to the present invention. The receiver may include a radio frequency (R.F.) input 102 that receives R.F. signals, and a band pass filter 104 that may select a certain desired R.F. signal which may be fed to a mixer 106. The receiver may further include a programmable frequency synthesizer 108 that may provide an output signal, on line 110, that may be mixed by mixer 106 with the R.F. signal on line 112, as illustrated. The programmable frequency synthesizer 108 may include a voltage-controlled oscillator 114 that provides a basis for the frequency generation. The programmable frequency synthesizer 108 may further include a regenerative frequency divider 116 and an integer divider 118, which in combination with the voltage control oscillator 114 provide the output signal on line 110. The programmable frequency synthesizer 108 will be described in more detail below. In one example, the receiver may further include a phase-locked loop 120 that is used to tune the voltage-controlled oscillator 114 of the programmable frequency synthesizer 108. According to one example, the phase-locked loop may include a charge pump device (not shown), and a loop filter 122 may be provided to filter out unwanted components of the signal from the phase-locked loop. The loop filter 122 may be a low-pass or averaging filter that acts to stabilize the loop and eliminate spikes or other noise from the signal from the phase-locked loop.

According to one embodiment, the programmable frequency synthesizer 108 may include a single narrow-band voltage-controlled oscillator (VCO) 114, and two programmable dividers, namely the regenerative frequency divider 116 and the integer divider 118. The VCO 114 may tune over a selected frequency range, for example, 2,500 MHz to 3,000 MHz, which may be relatively narrow compared to the frequency range of the output signal. However, it is to be understood that many different VCO's having different operating frequency ranges may be used, depending on applications of the synthesizer. The phase-locked loop 120 may provide fine frequency control, and the two programmable dividers 116, 118 may set the frequency range of the output signal 110. In one example, the programmable frequency synthesizer 108 may be adapted to provide continuous frequency coverage from less than 50 MHz to more than 1,100 MHz. However, it is to be appreciated that the programmable frequency synthesizer is not so limited and may be adapted to operate over a number of different frequency ranges, as desired. For example, the programmable frequency synthesizer may be programmed to produce an output signal in television bands, namely the ranges 50–80 MHz, 174–230 MHz and 470–860 MHZ. In one example, the output signal has a frequency that is derived from the frequency of the VCO 114 divided by the product of the two programmable dividers 116, 118. In another example, the programmable frequency synthesizer 108 may also include a divide-by-two block coupled to the output of the integer divider 118, as will be described in more detail below.

Figure 2:
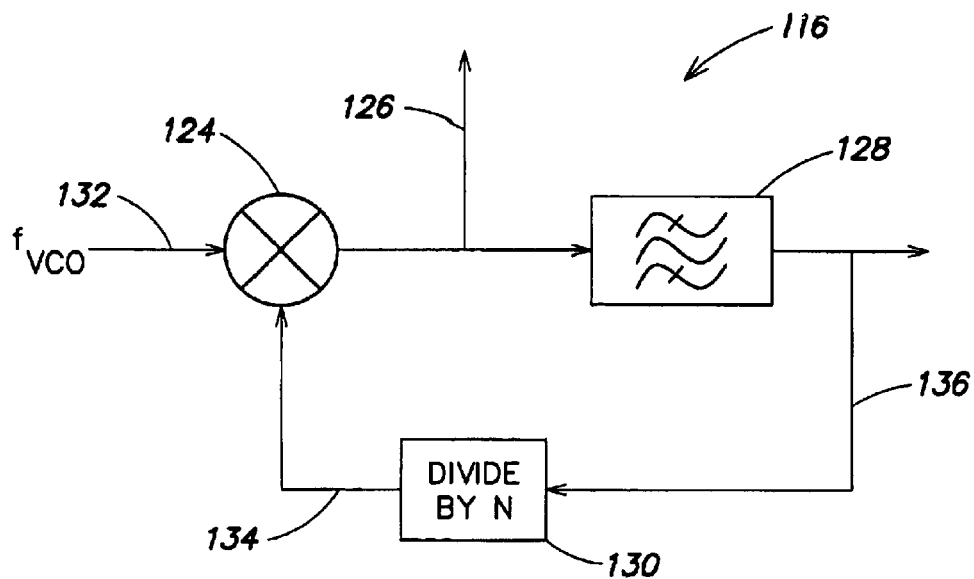
FIG. 2 is a schematic block diagram of one example of the regenerative frequency divider according to aspects of the present invention.

Referring to FIG. 2, there is illustrated one example of the regenerative frequency divider 116 of FIG. 1. According to the illustrated example, the regenerative frequency divider includes a mixer 124, and a bandpass filter 128 and a division block 130 provided in a feed back loop, as shown. The regenerative frequency divider receives a first signal $S_1$ from the VCO on line 132, the signal $S_1$ having a frequency given by:

$$S_1 = f_{VCO} \quad (1)$$

where $f_{VCO}$ is the output frequency of the VCO. The regenerative frequency divider outputs a second signal $S_2$ on line 126. The second signal $S_2$ has a frequency given by:

$$f_{REGEN} = f_{VCO} \pm \frac{f_{REGEN}}{N} \quad (2)$$

The division block 130 divides the frequency of a received input signal, on line 136, by N, where N is a programmable integer, and provides an output signal on line 134. The mixer 124 adds and/or subtracts the signal received 134 and first signal received on line 132 to generate the second signal having the frequency $f_{REGEN}$. The division block 130 may be any type of programmable divider, known in the art or future developed. Therefore, following conventional algebra:

$$f_{REGEN} * \left(1 \pm \frac{1}{N}\right) = f_{VCO}$$

$$f_{REGEN} * \left(\frac{N \pm 1}{N}\right) = f_{VCO}$$

and thus, the frequency, $f_{REGEN}$, of the output signal from the regenerative frequency divider (i.e., the second signal $S_2$) is given by:

$$f_{REGEN} = \left(\frac{N}{N \pm 1}\right) * f_{VCO} \quad (3)$$

where: N is the programmed division ratio in the regenerative frequency divider, and $f_{VCO}$ is the operating frequency of the VCO.

From the foregoing, it can be seen that the regenerative frequency divider 116 performs a fractional multiplication of the frequency of the input signal received from the VCO 114. This is advantageous because it removes any harmonic relationship between the final output frequency and the operating frequency of the VCO. Thus, no harmonic output of either of the divider chains will coincide with the operating frequency of the VCO, thereby avoiding the problem of self-jamming of the receiver. The regenerative frequency divider may include a band-pass filter 128 that may select a single frequency, or narrow range of frequencies, thereby preventing unwanted signals from being fed to the divider block 130. In one example, the mixer 124 may be a single-sideband mixer, which may eliminate the need for the filter 128.

As shown in FIG. 1, the output signal from the regenerative frequency divider may be provided, on line 126, to an input of the integer divider 118. The integer divider 118 divides the frequency of the received signal by a programmable integer M and provides an output signal on line 140. The value of integer M is dependant on the desired output frequency range and may be programmed according to an input from, for example, a microprocessor or an operator, as will be discussed in more detail below. Thus, the frequency of the signal on line 140 is determined by a combination of the frequency of the signal provided by the VCO 114, the programmable division ratios N and M of the regenerative frequency divider 116 and the integer divider 118, respectively. Allowing both N and M to be programmable allows the frequency synthesizer to generate a signal in a wide range of frequencies from a fairly narrowband VCO.

Referring again to FIG. 1, the illustrated exemplary embodiment of the frequency synthesizer includes a quadrature generator 142 coupled to the output of the integer divider 1 18. It is to be appreciated that although in the illustrated example the quadrature generator 142 forms part of the programmable frequency synthesizer 108, the invention is not so limited and the quadrature generator 142 may be provided as a separate component in the receiver, distinct from the programmable frequency synthesizer 108. In one example, the quadrature generator 142 may receive an input signal on line 140 and provide an output signal on line 110 that includes an in-phase component and a quadrature component. The quadrature generator 142 may also include a divide-by-two circuit that divides the frequency of the input signal by two and provides a 50% duty cycle for the output signal and in-phase and quadrature outputs. Therefore, the frequency of the output signal provided on line 110 is given by:

$$f_{OUT} = \left(\frac{1}{2}\right)\left(\frac{1}{M}\right)\left(\frac{N}{N-1}\right) * f_{VCO} \tag{4}$$

Figure 3:
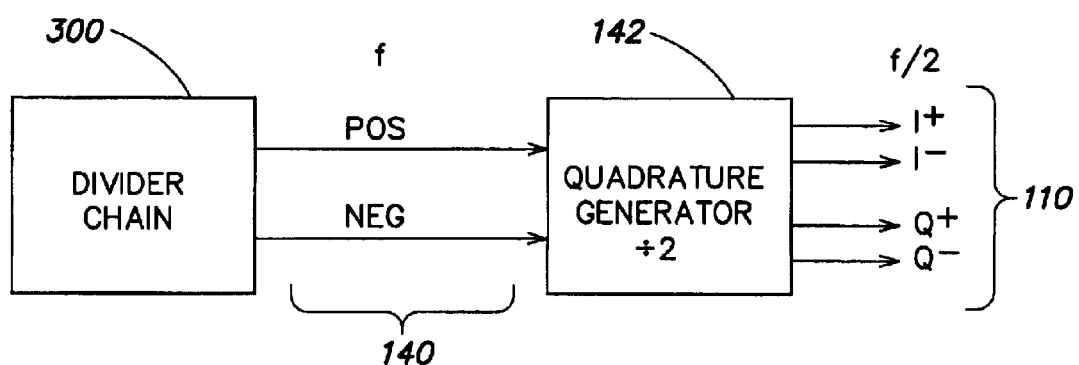
FIG. 3 is schematic block diagram of the divider chain and quadrature generator used in the programmable frequency synthesizer of FIG. 1.

According to one exemplary embodiment, the signal provided on line 140 may include a positive and a negative component which are provided as inputs to the quadrature generator 142, as shown in FIG. 3. The divider chain 300 includes the regenerative frequency divider 116 and the integer divider 118. The quadrature generator 142 may provide four output signals on line 110, an in-phase and a quadrature component for each of the positive and negative components of the input signal.

Figure 4:
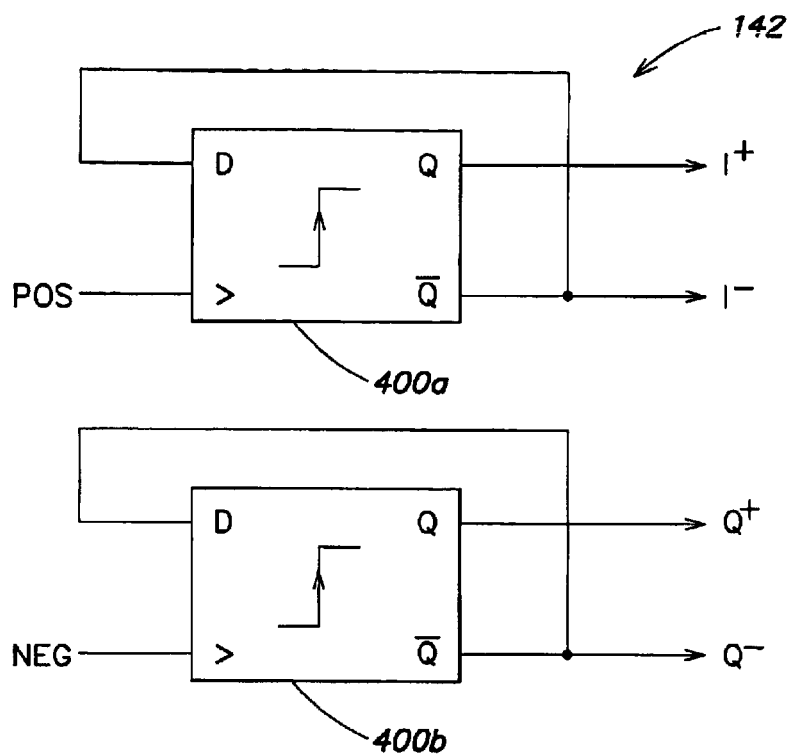
FIG. 4 is a block diagram of one example of an implementation of the quadrature generator of FIG. 3.
Figure 5:
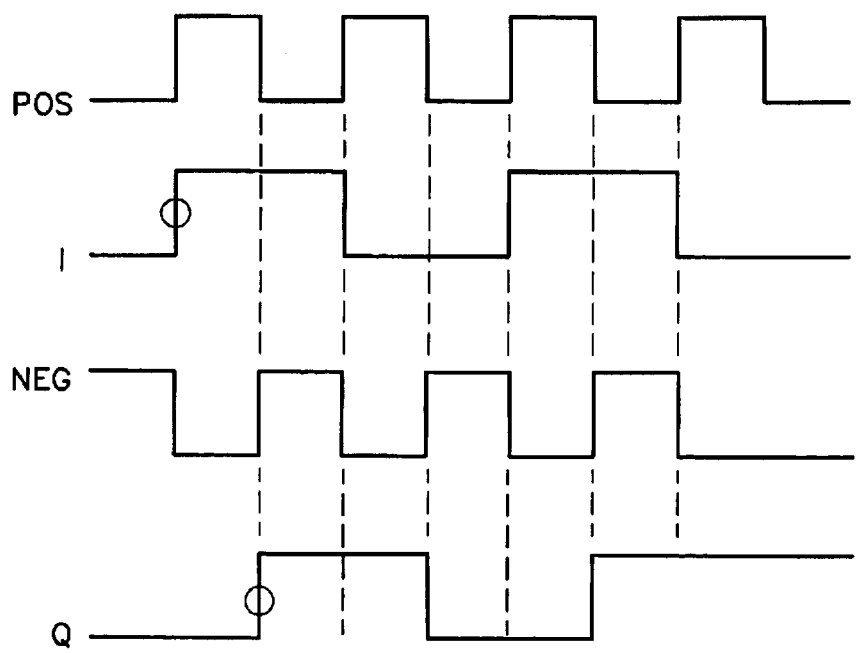
FIG. 5 is an example of timing diagram for the quadrature generator of FIG. 4.

Referring to FIG. 4, there is illustrated an exemplary implementation of the quadrature generator 142. It is to be appreciated that the quadrature generator is not limited to the illustrated implementation and may be implemented using any appropriate circuitry. In the illustrated example, the quadrature generator includes two D-type flip-flops 400a, 400b which receive the positive and negative components, respectively, of the input signal. The first D-type flip-flop 400a generates the two in-phase components of the output signal, and the second D-type flip-flop generates the two quadrature components of the output signal. It is to be appreciated that although the illustrated example includes D-type flip-flops, the circuit may be implemented using JK-type flip-flops, or another suitable technology. As shown in the timing diagram in FIG. 5, the frequency of the components of the output signal is half that of the components of the input signal, because the flip-flops clock on only the positive going edges of the positive and negative components respectively. In this manner, the division by two of the frequency of the input signal is achieved. The flip-flops clocking on the positive-going edges only also produces the 90° phase shift between the in-phase (I) and quadrature (Q) components, as shown.

Figure 6:
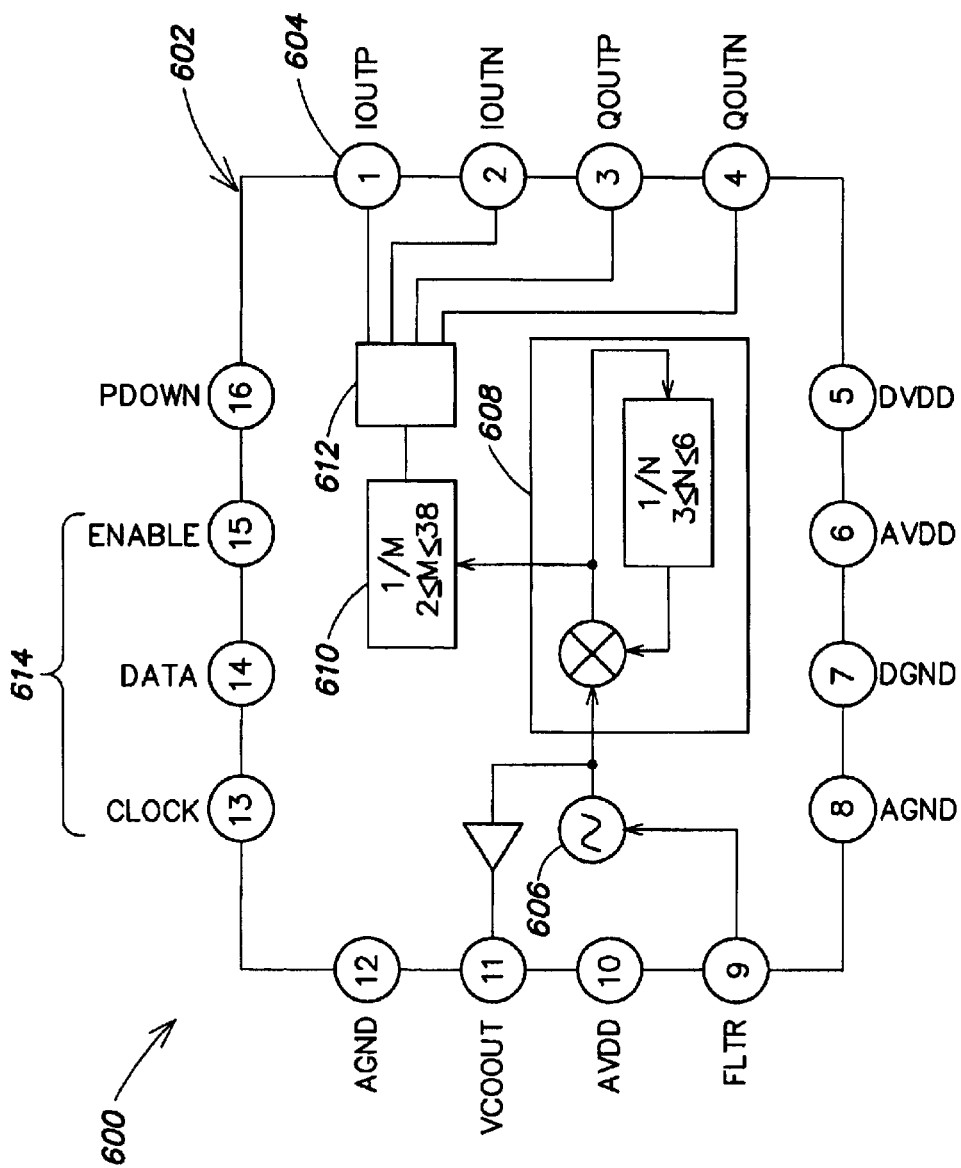
FIG. 6 is a schematic block diagram of one example of a pin layout of the programmable frequency synthesizer according to aspects of the present invention.

According to one embodiment, the programmable frequency synthesizer 108 (see. FIG. 1) may be provided as an integrated circuit. Referring to FIG. 6, there is illustrated an exemplary pin diagram of one example of an integrated circuit implementation of a programmable frequency synthesizer 600. According to this example, the integrated programmable frequency synthesizer 600 includes an integrated circuit chip 602 that may be provided with a number of pins 604 to connect to external circuitry. It is to be appreciated that the illustrated pin diagram is one example, and the invention is not so limited. The integrated circuit may be provided with more or fewer pins as desired, and the pins may be arranged in any order, not necessarily as illustrated. For example, pins may be provided along only two edges of the integrated circuit chip 602, as opposed to all four sides as illustrated. The integrated programmable frequency synthesizer may include an integrated VCO 606, a regenerative frequency divider 608, an integer divider 610, and a quadrature generator 612, as described above. The dividers may be programmed via a serial interface 614. The serial interface may include a three-line interface, as in the illustrated example. A programming signal may be received via the three-line interface from, for example, a microprocessor or keypad or other operator interface. The integrated circuit chip 602 may include R.F. output pins (1–4) where the in-phase and quadrature components of the output signal may be provided. The integrated circuit chip 602 may also include pins for receiving power and for connecting to ground.

Figure 7:
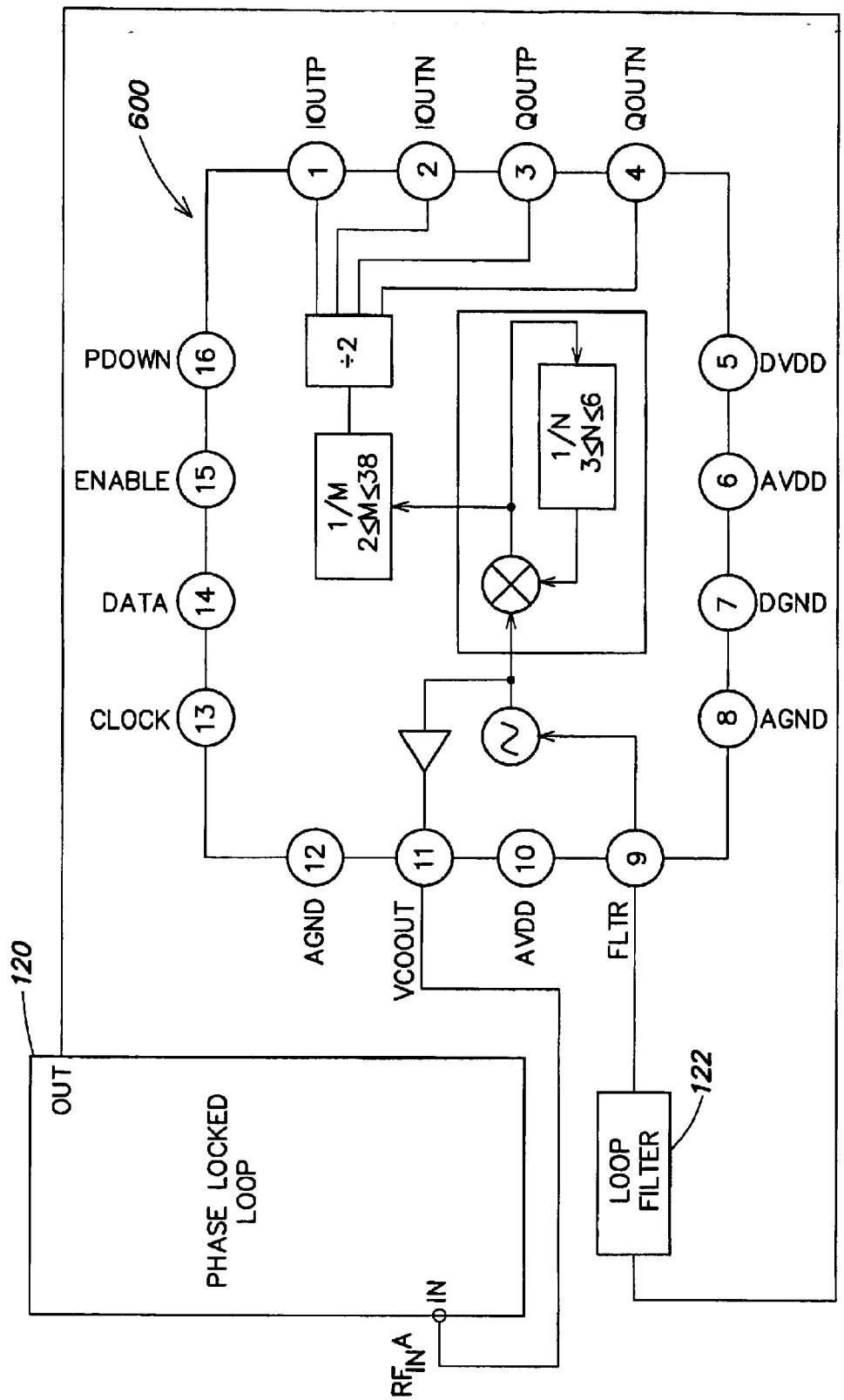
FIG. 7 is a schematic block diagram of the integrated frequency synthesizer of FIG. 6 connected with a phase-locked loop.

Referring to FIG. 7, an external phase-locked loop 120 may be connected to the integrated programmable frequency synthesizer to tune the VCO, as described above. In one example, the phase-locked loop 120 may include two programmable dividers, for example, and R.F. divider having a division ratio A, and a reference divider having a division ratio B. The phase-locked loop 120 may further include a reference clock that provides timing for the phase-locked loop and the frequency synthesizer 600. In this case, the frequency of the VCO, tuned by the phase-locked loop, is given by:

$$f_{VCO} = \left(\frac{A}{B}\right) * f_{CLOCK} \tag{5}$$

and therefore, the frequency of the output signals, on pins 14, is given by:

$$f_{OUT} = \left(\frac{1}{2}\right)\left(\frac{1}{M}\right)\left(\frac{N}{N-1}\right)\left(\frac{A}{B}\right) * f_{CLOCK} \tag{6}$$

Figure 8:
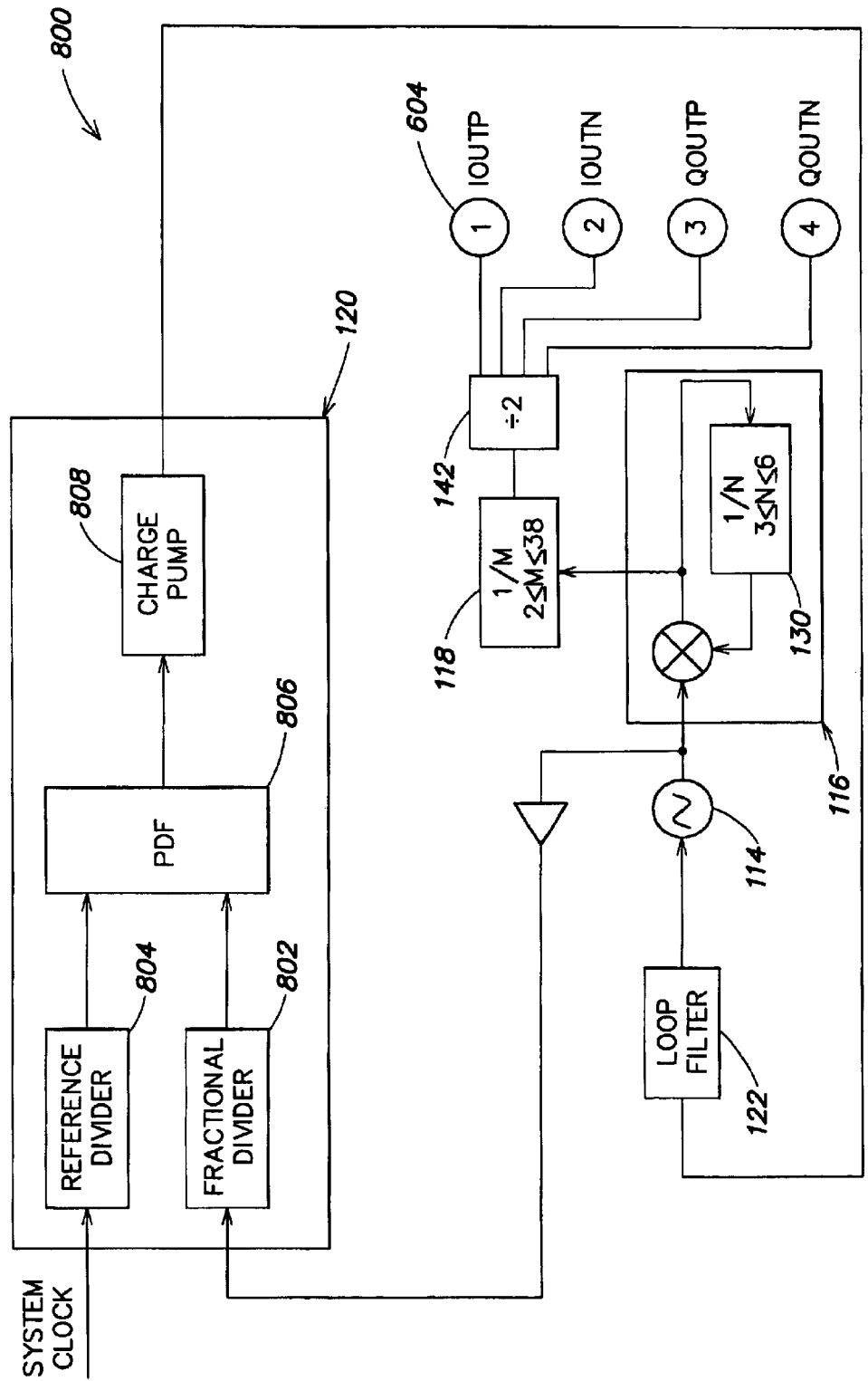

According to one example, the phase-locked loop 120 may be provided with the programmable frequency synthesizer on a single integrated circuit chip 800. A block diagram of an exemplary embodiment of this example is illustrated in FIG. 8. It is to be appreciated that while the phase-locked loop 120 may include both a fractional divider 802 and a reference divider 804, as illustrated and described above, it is not so limited. The phase-locked loop 120 may include only one of the dividers, either the fractional divider or the reference divider, or may include an integer divider (not shown) in combination with the reference divider, or may have another configuration as known in the art. In one example, the phase-locked loop 120 may further include a phase-frequency detector 806 and a charge pump 808. The phase-frequency detector 806 provides a control signal to the charge pump 808 that causes the charge pump to "pump up," i.e., output a current signal, or to "pump down," i.e., to sink a current signal, thereby either decreasing or increasing the tuning voltage for the voltage controlled oscillator. In this manner, the phase-locked loop controls the frequency $f_{VCO}$ to a desired value.

Thus, as discussed above, the frequency of the output signal may be dependant on four programmable variables, which allows for a wide-band and flexible frequency coverage. In addition, the programmable frequency synthesizer may improve the overall phase noise of the receiver because it includes two frequency dividers, namely the regenerative frequency divider and the integer divider. As known in the art, each divider provides an improvement of 3 dB in the phase noise of the output signal. Furthermore, when the programmable frequency synthesizer also includes the divide-by-two block in the quadrature generator 142, this provides an additional 3 dB improvement in the phase noise of the output signal.

Having thus described various illustrative, non-limiting embodiments and aspects thereof, modifications and alterations will be apparent to those of skill in the art. Such modifications and alterations are intended to be included in this disclosure, which is for the purpose of illustration and explanation and not intended to define the limits of the invention. The scope of the invention should be determined from proper construction of the appended claims, and their equivalents.

What is claimed is:

1. A programmable frequency synthesizer comprising
a voltage-controlled oscillator that provides a first signal;
a regenerative frequency divider coupled to the voltage-controlled oscillator that receives the first signal and performs a fractional multiplication of a first frequency of the first signal to provide a second signal having a second frequency; and
a programmable integer divider, coupled to the regenerative frequency divider, that receives the second signal and divides the second frequency by a predetermined integer to provide a third signal having a third frequency.

2. The programmable frequency synthesizer as claimed in claim 1, further comprising a quadrature output generator, coupled to the programmable integer divider, that receives the third signal and provides at least two quadrature output signals, each quadrature output signal having the third frequency.

3. The programmable frequency synthesizer as claimed in claim 2, wherein the first signal has a first frequency range and the at least two quadrature output signals have an output frequency range that is larger than the first frequency range.

4. The programmable frequency synthesizer as claimed in claim 3, wherein the at least two quadrature outputs include differential outputs.

5. The programmable frequency synthesizer as claimed in claim 2, further including a serial interface adapted to receive a programming signal to determine a frequency range of the output signal.

6. The programmable frequency synthesizer as claimed in claim 5, wherein the serial interface includes a three-line serial interface.

7. The programmable frequency synthesizer as claimed in claim 2, wherein the quadrature output generator includes a divide-by-two circuit.

8. The programmable frequency synthesizer as claimed in claim 1, wherein a phase locked loop is coupled to the programmable frequency synthesizer to tune the voltage-controlled oscillator.

9. The programmable frequency synthesizer as claimed in claim 1, wherein the programmable frequency synthesizer is provided on an integrated circuit.

10. The programmable frequency synthesizer as claimed in claim 9, wherein an operating voltage range of the programmable frequency synthesizer is within a range of approximately 3–5 volts.

11. The programmable frequency synthesizer as claimed in claim 1, further comprising a mixer connected between the regenerative frequency divider and the integer divider, the mixer selecting a desired frequency range of the second signal.

12. The programmable frequency synthesizer as claimed in claim 11, wherein the mixer is a single-sideband mixer.

13. The programmable frequency synthesizer as claimed in claim 1, wherein the first signal has a first frequency range, and the third signal has a third frequency range that is larger than the first frequency range.

14. A tunable receiver operable over a wide frequency band, the receiver comprising:
a programmable frequency synthesizer including a voltage-controlled oscillator, and adapted to generate an output signal having a frequency derived from a combination of the voltage-controlled oscillator, a regenerative frequency divider and a programmable integer divider;
a phase-locked loop coupled to the programmable frequency synthesizer to tune an operating frequency of the voltage-controlled oscillator, and
a loop filter coupled to an output of the phase-locked loop and to an input of the programmable frequency synthesizer.

15. The tunable receiver as claimed in claim 14, wherein the programmable frequency synthesizer includes a quadrature output generator, coupled to the programmable integer divider, and wherein the output signal includes at least one in-phase signal and at least one quadrature signal.

16. The tunable receiver as claimed in claim 14, wherein the programmable frequency synthesizer includes:
the voltage-controlled oscillator that provides a first signal;
the regenerative frequency divider coupled to the voltage-controlled oscillator that receives the first signal and performs a fractional multiplication of a frequency of the first signal to provide a second signal having a second frequency; and
the programmable integer divider, coupled to the regenerative frequency divider, that receives the second signal and divides the second frequency by a predetermined integer to provide the output signal having a third frequency.

17. The tunable receiver as claimed in claim 16, further comprising a controller that generates a programming signal to program the third frequency; and wherein the programmable frequency synthesizer includes a serial interface adapted to receive the programming signal.

18. The tunable receiver as claimed in claim 17, wherein the programming signal includes a value of the predetermined integer.

19. A method for synthesizing an output signal having an output frequency range, the method comprising acts of:
generating, with an oscillator, a first signal having a first frequency range;
performing a fractional multiplication of the first frequency range of the first signal to provide a second signal having a second frequency range; and
dividing the second frequency range with an integer divider to obtain the output signal having the output frequency range;

wherein the output frequency range is larger than the first frequency range.

20. The method as claimed in claim 19, further comprising an act of generating, from the output signal, at least one in-phase signal and at least one quadrature signal.

21. The method as claimed in claim 19, further comprising an act of receiving a programming signal that determines the output frequency range.

22. A programmable frequency synthesizer comprising:
a voltage-controlled oscillator to generate a first signal having a first frequency range;
means for synthesizing, from the first signal, an output signal having an output frequency range that is larger than the first frequency range, said means being adapted to receive the first signal from the voltage-controlled oscillator.

23. The programmable frequency synthesizer as claimed in claim 22, wherein the means for synthesizing includes a regenerative frequency divider, coupled to the voltage-controlled oscillator, and an integer divider coupled to the regenerative frequency divider.

24. The programmable frequency synthesizer as claimed in claim 23, wherein the means for synthesizing further includes a quadrature generator; and wherein the output signal is a differential output signal including at least one in-phase component and at least one quadrature component.

* * * * *